United States Patent [19]

Rietsch

[11] 4,065,665

[45] Dec. 27, 1977

[54] METHOD AND APPARATUS FOR THE DETERMINATION OF START TIME DIFFERENCE AND OVERALL PHASE SHIFT BETWEEN TWO SIGNALS

[75] Inventor: Eike Rietsch, Celle, Germany

[73] Assignee: Deutsche Texaco Aktiengesellschaft, Hamburg, Germany

[21] Appl. No.: 664,441

[22] Filed: Mar. 8, 1976

[51] Int. Cl.² ............................................. G01R 25/00
[52] U.S. Cl. .................................. 364/487; 324/83 D
[58] Field of Search .................... 235/151.31; 340/17; 324/83 A, 83 D, 78 D, 77 G, 107

[56] References Cited

U.S. PATENT DOCUMENTS 3,764,903  10/1973  Griswold .......................... 324/83 D
3,968,493  7/1976  Last et al. ......................... 324/83 D Primary Examiner—Edward J. Wise
Attorney, Agent, or Firm—Thomas H. Whaley; Carl G. Ries; Ronald G. Gillespie

[57] ABSTRACT

Apparatus and method determines the time shift and total phase difference between two alternating current signals. A value $\psi$ $(f)$ corresponding to the phase relationship between the two signals is determined for each frequency $f$ contained in the two signals. A slope $A$ and an ordinate section $B$ of the best fitting straight line $g(f) = Af + B$ through the totality of the values $\psi$ $(f)$ so obtained is determined. The phase shift $\psi_o = B$ modulo $(2\pi)$ is determined from the ordinate section $B$ and the time shift $\tau = A/2\pi$ from the slope $A$.

15 Claims, 3 Drawing Figures

METHOD AND APPARATUS FOR THE DETERMINATION OF START TIME DIFFERENCE AND OVERALL PHASE SHIFT BETWEEN TWO SIGNALS

BACKGROUND OF THE INVENTION

Field of the Invention

The present invention relates to the determination of relationships between two alternating current signals, and, more particularly, to the phase shift and the time shift relationship between the two signals.

SUMMARY OF THE INVENTION

Apparatus and method determines the time shift and total phase difference between two alternating current signals. A value $\psi(f)$ corresponding to the phase relationship between the two signals is determined for each frequency $f$ contained in the two signals. A slope $A$ and an ordinate section $B$ of the best fitting straight line $g(f) = Af + B$ through the totality of the values $\psi(f)$ so obtained is determined. The phase shift $\psi_o = B$ modulo ($2\pi$) is determined from the ordinate section $B$ and the time shift $\tau = A/2\pi$ from the slope $A$.

The objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustrative purposes only and are not to be construed as defining the limits of the invention.

DESCRIPTION OF THE INVENTION

Figure 1:
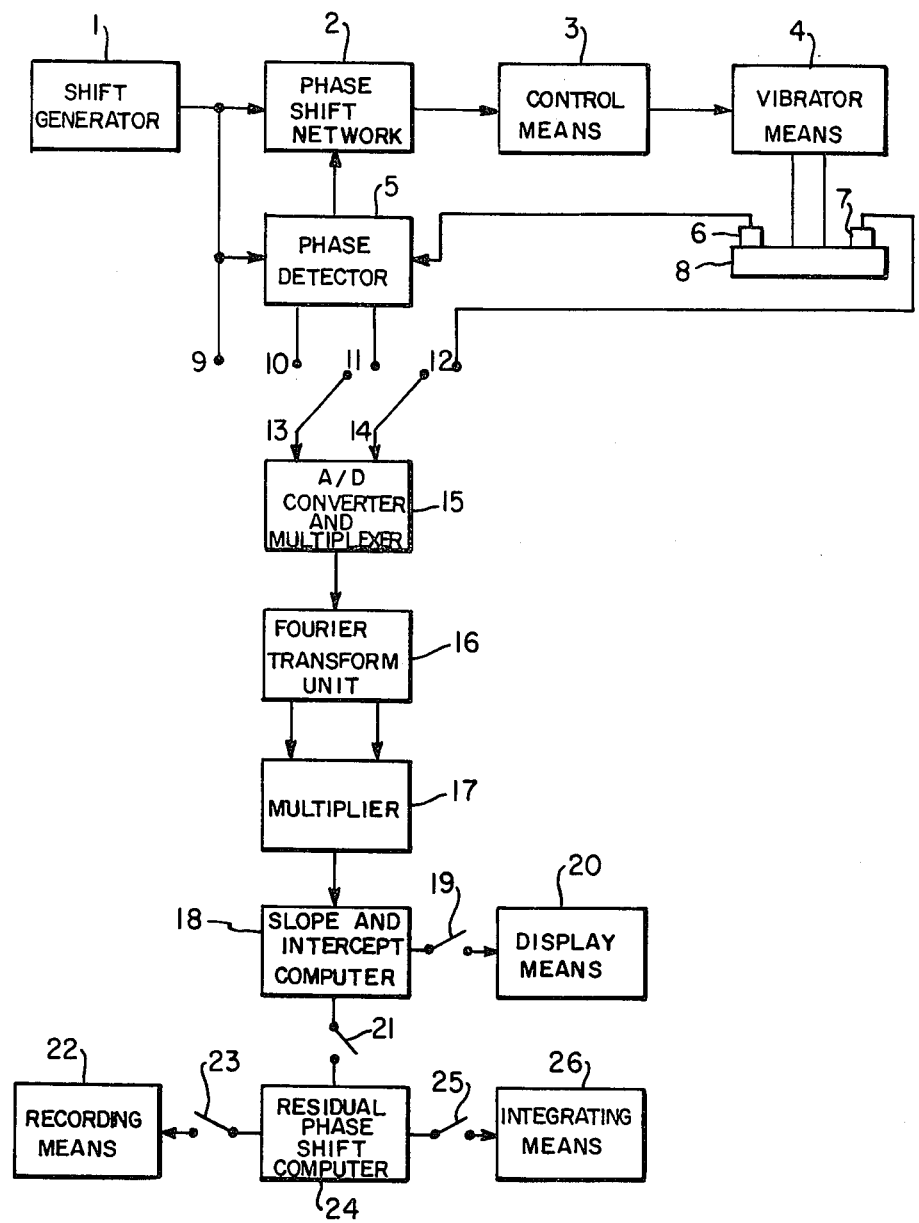
FIG. 1 is a simplified block diagram of apparatus, constructed in accordance with the present invention, for the determination of the phase shift and the time shift between two signals.

The invention relates to a method and apparatus for the determination of start time difference and overall phase shift between two signals. It is particularly, but not exclusively, intended for testing of the similarity of vibrators for the generation of seismic signals. Such vibrators are, for example, employed in the seismic method known under the name "Vibroseis". In this exploration method signals of several seconds length, essentially constant amplitude and — within a certain frequency range — monotonously increasing or decreasing frequency are transmitted into the subsurface in form of elastic waves. A portion of this signal is reflected from changes in the elastic parameters of the subsurface, which are frequently related to boundaries of geological formations. These reflected signals are detected at the earth's surface by means of a plurality of geophones and recorded on magnetic tape in form of a seismogram. Owing to their length, signals reflected in different depths, and therefore arriving at different times, overlap. In order to separate signals arriving at different times, and therefore reflected in different depths, the long signals have to be compressed to short, impulse-like ones. This can, for example, be achieved by correlating the recorded seismogram with the seismic signal. Usually, three to seven synchronously operating vibrators are employed in order to increase the amount of useful seismic energy transmitted into the subsurface. In this connection, the term synchronous means that the motion of the base-plate of each vibrator has a fixed phase relation to a so-called pilot signal. This fixed phase relation between the motion of the base-plate of each vibrator and the pilot signal guarantees that the signals transmitted into the subsurface by all the vibrators add up coherently. If the phase relationship between base-plate motion and pilot signal is determined in such a way that the phase of the emitted seismic signal is approximately equal to that of the pilot signal, this latter signal rather than the (not recorded) seismic signal can be used for correlating the recorded seismogram.

Therefore, a successful use of vibrators for the generation of the seismic signals requires not only inphase operation of the vibrators but also that the motion of their respective base-plates has a fixed, pre-defined relation to the pilot signal.

This fixed phase relationship is provided by a phase lock circuit which detects the phase difference between base-plate motion and pilot signal and which, upon deviation from the pre-set value, actuates a phase shift network to correct for this deviation.

Usually the motion of the base-plate is recorded by means of an accelerometer attached to the base-plate structure. The output signal of the accelerometer is heavily distorted by harmonics and must therefore be smoothed. This is usually done by two-fold integration and subsequent amplitude compensation. This smoothing causes a slight phase shift and delay of the accelerometer signal, which, for the sake of comparison with the pilot signal is compensated by passing the latter signal through filters providing the same phase shift. In a particular phase lock circuit the filtered pilot signal is phase-shifted by 90° prior to comparison with the smoothed base-plate signal.

In view of the importance of phase control for the generation of strong seismic signals, and, for the successful contraction of the long reflected signals in the seismogram, similarity tests of the vibrators are performed at regular intervals. In these tests proper functioning of the phase detection circuit, the phase shift network and the accelerometer is checked.

A standard procedure for checking the phase lock circuit is to record the two signals applied to the circuit, i.e., the smooth base-plate accelerometer signal and the filtered pilot signal, and to inspect play-backs of the recordings for indications of phase shifts and start time differences. Start time differences in the order of milliseconds and phase shifts of a few degrees are, however, difficult to detect on usual play-backs. It is particularly difficult if there exists a specified phase difference of 90° between the two signals. In this case, a sufficiently accurate optical similarity control as described above can hardly be performed.

In principle, Lissajous patterns could be used for determination of the phase relation between the two signals. But due to harmonics still present in the smoothed accelerometer signal no regular stable ellipse (with circle and straight line as extreme cases) appears, but rather a distorted bean-like figure which furthermore changes its position in case there is a significant time shift between the two signals.

The accelerometer and the electronic circuits passed by the accelerometer signal on its way to the phase lock circuit can best be checked by means of an independent measurement of the base-plate motion, e.g., by means of a second test accelerometer attached to the base plate structure close to the first accelerometer (in the following termed system accelerometer). Of course the output signal of this test accelerometer is to a large degree distorted by harmonics and, in general, not fit for a comparison of the signals supplied to the phase lock system. It has to be smoothed as well. Upon comparison of play-backs of the two smoothed accelerometer signals the problem recurs that time and phase shifts are difficult to detect with sufficient accuracy.

The advantages are also inherent in the method and apparatus for control of vibrators as described by Landrum (U.S. Pat. No. 3,863,202). In his method play-backs of traces have to be inspected for phase shifts and start time differences as well.

The subject of this invention is therefore a method and apparatus for automatic determination and digital display of start time difference and phase shift between two signals. This method can furthermore be used to display the oscillations of the phase of one of the signals about the phase of the other signal after accounting for start time difference and overall phase shift (in the following the term residual phase shift is used for these oscillations). It is thus possible to display in form of a curve how, after accounting for start time difference and overall phase shift, the phase of the one signal leads the phase of the other signal at certain frequencies and lags it at other frequencies.

The essential advantage of this method as compared with the tedious comparison of traces as presently required in vibrator similarity tests is that two clearly defined numeric values for start time difference and overall phase shift are obtained and that the oscillation of the phase of the one signal about the phase of the other signal — after accounting for start time difference and overall phase shift — can be represented as a function of the frequency.

Further advantages will be evident from the following description.

The method underlying this invention essentially consists of the following five steps:

In the first step a value $\psi(f)$ characterizing the phase relation between the two signals is determined for each frequency $f$ contained in the two signals.

In the second step slope $A$ and ordinate section $B$ are determined of the best (least square) straight line $g(f) = Af + B$ passing through the values $\psi(f)$, characterizing the phase relation between the two signals as determined in the first step.

In the third step the start time difference $\tau$ between the two signals and the overall phase difference $\psi_o$ are determined according to the formulae $$\tau = A/(2\pi) \quad (1)$$

$$\psi_o = B \text{ modulo } (2\pi) \quad (2)$$

The abbreviation modulo $2\pi$ is understood to mean that a multiple of $2\pi$ is to be added to $B$ or to be subtracted from $B$ so that the value of $\psi_o$ is less than or equal to $\pi$ and greater than or equal to $-\pi$ ($-\pi \leq \psi_o \leq \pi$).

In the fourth step the residual phase shift $$R(f) = \psi(f) - g(f) \quad (3)$$

is determined. This residual phase shift indicates which further phase differences exist at the different frequencies within the frequency range of the two signals after accounting for possible differences in start time and for an overall phase shift.

Finally, in a fifth step a numeric value can be determined which is representative of the amount of this residual phase shift.

The values $\psi(f)$ characterizing the phase relation between the two signals as described in the first step can be determined in various ways.

The easiest way is to subject the two signals to be compared to a Fourier transformation and to multiply the Fourier transform of the one signal with the complex conjugate of the Fourier transform of the other signal. Real and imaginary part of this product are usually denoted by cospectrum and quadraturspectrum, respectively. The arcustangent of the quotient of quadraturspectrum and cospectrum gives the desired values $\psi(f)$ characterizing the phase relation between the two signals at the frequency $f$. Equivalent values of $\psi(f)$ can also be obtained in a different way.

One can, for example, first correlate the two signals which are to be compared and subject the resulting correlation function to a Fourier transformation. The real and imaginary part of the Fourier transform so obtained correspond to cospectrum and quadraturspectrum, respectively.

A third approach to the values $\psi(f)$ is to subject both signals to a Fourier transformation, the difference of the phase spectra of the two signals is equal to $\psi(f)$ — possibly up to a multiple of $2\pi$ due to the fact that the arcus tangent is a multivalued function.

The principle underlying the method can be characterized as follows.

Let $s_0(t)$ and $s_1(t)$ be two signals which should be compared and let $S_0(f)$ and $S_1(f)$ denote their respective Fourier transforms (frequency spectra). These complex frequency spectra can be represented in form of amplitude spectrum $M(f)$ and phase spectrum $\phi(f)$.

$$S_0(f) = M_0(f) \exp(i\phi_0(f))$$

$$S_1(f) = M_1(f) \exp(i\phi_1(f))$$

A law well known in the theory of Fourier transformations states that the Fourier transform of two — apart from a time shift (e.g., start time difference) — identical signals.

$$s_0(t) \text{ and } s_1(t) = s_0(t - \tau) \quad (4)$$

differ by the factor $\exp(2\pi i f \tau)$. This means that the difference $$\phi_1(f) - \phi_0(f) = 2\pi\tau f \quad (5)$$

of the phase spectra of the two signals as function of the frequency is a straight line through the origin with the slope of the straight line equal to the $2\pi$-fold of the time shift between the two signals. On the other hand, the Fourier transform of two signals of the general form $$s_0(t) = \cos(\lambda(t)) \text{ and } s_1(t) = \cos(\lambda(t) + \psi_0) \quad (6)$$

differ only by the constant factor $\exp(i\psi_0)$ for all frequency above a lower frequency limit which depends on $\lambda(t)$. For the signals considered here this lower frequency limit is as low as a few hertz. Therefore $$\phi_1(f) - \phi_0(f) = \psi_0 \quad (7)$$

The function $\lambda(t)$ appearing in the argument of the cosine in equation (6) denotes an arbitrary, monotonously increasing or decreasing function of time. For the most frequently used Vibroseis signal (known under the name "linear sweep" to those experienced in the art), $\lambda(t)$ has the form $$\lambda(t) = 2\pi[f_0 t + (f_1 - f_0)t^2/(2T)] \text{ for } 0 \leq t \leq T \quad$$

where $f_0$, $f_1$ and $T$ denote lower and upper frequency limits and length of the sweep, respectively.

A combination of the relation between equations (4) and (5) and between equations (6) and (7) shows that the phase spectra of the two signals $$s_0(t) = \cos(\lambda(t)), \, s_1(t) = \cos(\lambda(t-\tau) + \psi_0) \quad (8)$$

are related to each other by $$\psi(f) = \phi_1(f) - \phi_0(f) = 2\pi\tau f + \psi_0 \quad (9)$$

As indicated in equation (9) the difference of the phase spectra of the two signals is the function $\psi(f)$ determined in the first step of the method which characterizes the phase relation of the two signals as function of the frequency. This function can be obtained as the phase, i.e., the arcustangent of the quotient of imaginary and real part of the product $$S_1(f) S^*(f) = M_1(f) M_0(f) \exp(i[\phi_1(f) - \phi_0(f)]) \quad (10)$$

Because of equation (9) the straight line fitted — e.g., in the least squares sense — through the difference of the phase spectra of the two signals has a slope signal equal to the $2\pi$-fold of the start time difference $\tau$. It furthermore has, for the frequency $f=0$, an ordinate section which is equal to the phase difference $\psi_0$. Since the arcustangent is a multivalued function, the value $\psi_0$ so obtained is only determined modulo $2\pi$.

In real cases the difference $\psi(f)$ is not exactly a straight line. As an indicator or index of the amount of residual phase shift $\psi(f) - g(f)$ its variance or a monotonous function (e.g., square root) thereof may be used. Another indicator is, for example, the largest deviation of $\psi(f)$ from the straight line $g(f)$. A large value of this index may give rise to the decision to have the residual phase shift displayed as function of the frequency, for example in the form of a curve on an oscillograph.

Figure 2:
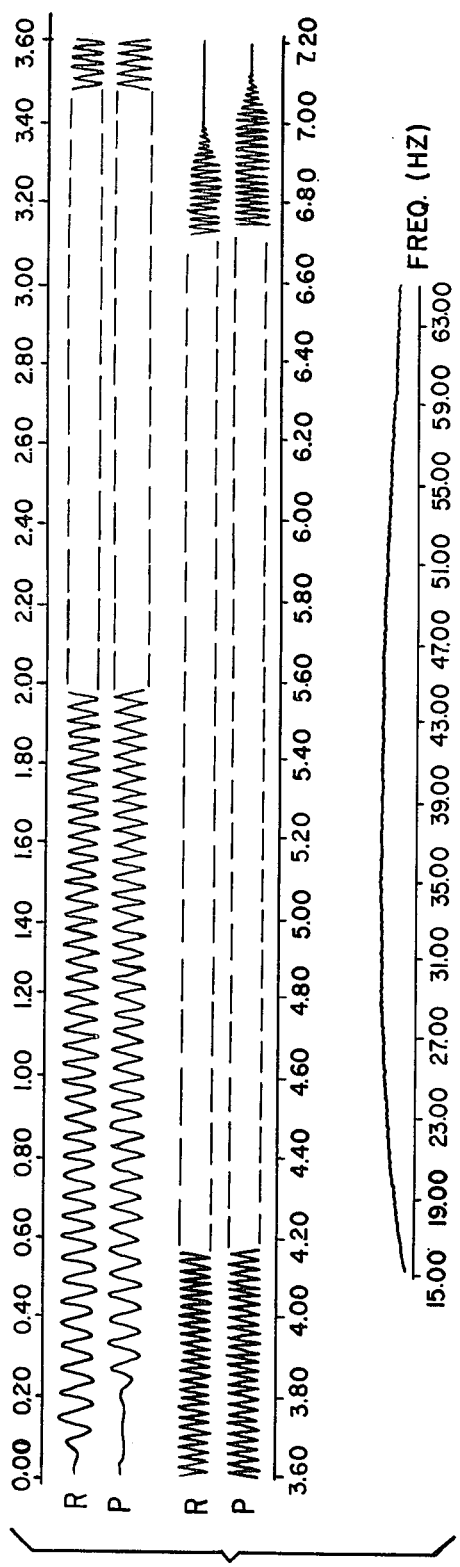
FIGS. 2 and 3 are graphical representations of waveforms occurring during the operation of the apparatus of FIG. 1.
Figure 3:
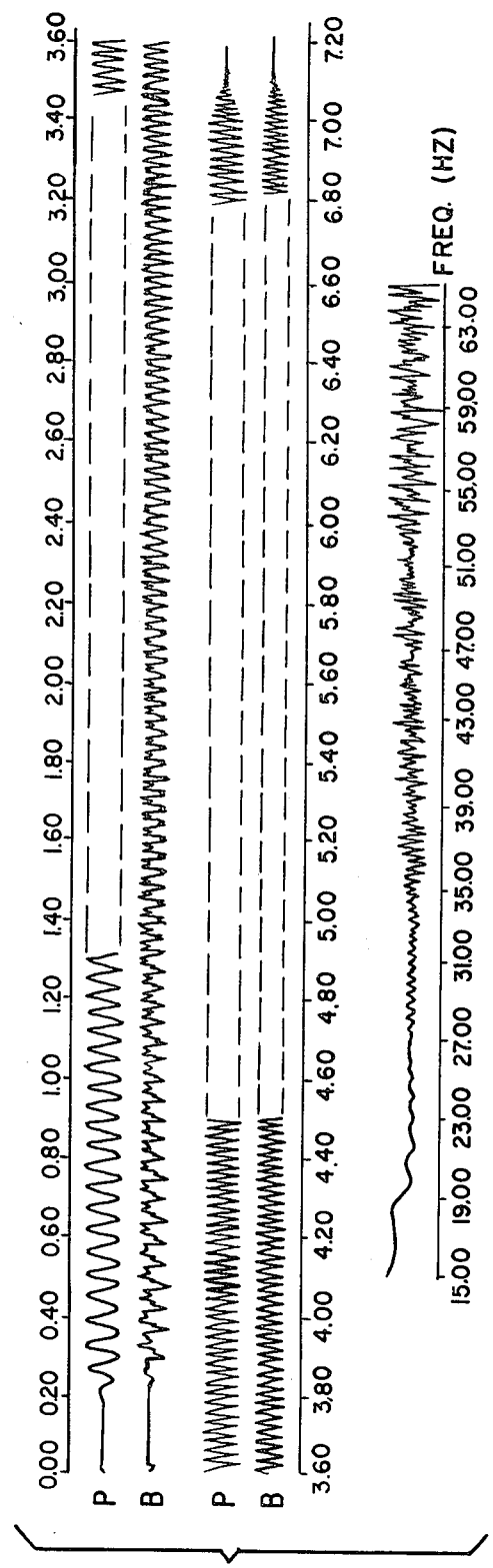

FIG. 1 shows the block diagram of an implementation of the method together with a possible application. Both FIGS. 2 and 3 show two Vibroseis signals recorded in a Vibroseis similarity test as well as the residual phase shift remaining after start time difference and overall phase shift between the two signals have been accounted for.

FIG. 1 shows how the present invention is related to already existing vibrator systems.

The Vibroseis signal generator 1 which may also be a receiver of a signal transmitted from the recording truck, supplies the Vibroseis signal via the phase shift network 2 to the vibrator control means 3 of the vibrator means 4. The Vibroseis signal and the output signal of a transducer 6 attached to the base-plate 8 are supplied to a phase detector 5. If a deviation is detected from the specified phase relation between the filtered pilot signal and the smoothed base-plate transducer signal an error signal is transmitted to the phase shift network 2 which shifts the phase of the signal controlling the vibration in such a way that the desired phase relationship is reestablished.

The signals from the output of the vibrator electronic denoted by the numerals 9-11 and the signals from the output 12 of the test accelerometer 7 are particularly, but not exclusively, suited to check the electronic and mechanical parts of the vibrators. Any two of these outputs may be connected to the two inputs 13 and 14 of the apparatus denoted by the numerals 13-26 which is an example of an implementation of the beforedescribed invention. These two inputs lead to an analog/digital converter and multiplexer 15. The multiplexed data is supplied to a Fourier transform unit 16. Typical systems available on the market are based on the fast Fourier transform (FFT) and can perform the Fourier transform of two signals in real time. The first step of the method is completed in the subsequent multiplexer 17 in which the Fourier transform of the one signal is multiplied with the complex conjugate of the Fourier transform of the other signal and in which the phase spectrum $\psi(f)$ of this product is determined. A slope and intercept computer 18 serves for the determination of the coefficients $A$ and $B$ of the best straight line $$g(f) = Af + B$$

passing through the values $\psi(f)$. If desired, the start time difference $\tau$ and the overall phase difference $\psi_0$ may be determined and displayed, e.g., by light-emitting diodes 20 which are connected to the circuit 18 by means of the switch 19. In addition, or alternatively, the residual phase shift may be determined by means of a residual phase shift computer 24 which is connected to the computer 18 by means of a switch 21. Integrating means 26 connected to computer 24 by means of switch 25 is required for the determination of an index for the amount of residual phase shift. This index may be used as a criterion for the decision whether an analog display of the residual phase shift is required. For this purpose, recording means 22 which performs this analog display is connected to the circuit 24 by means of the switch 23.

FIG. 2 shows two Vibroseis signals with frequency increasing linearly from 15-65 Hz which have been recorded during a similarity test. Because of their length they are displayed in two pieces. The signal denoted by R is the signal generated in the recording truck. This signal is transmitted to the vibrators by a radio and would correspond to the signal from output 9 in FIG. 1. The second signal denoted with P is the smoothed pilot signal used for comparison with the smoothed accelerometer signal and corresponds to the signal from output 10 in FIG. 1. An analysis by means of the method described before revealed that it is delayed by 139.2 msec with respect to the signal R and that an overall phase shift of 97.9° exists between the two signals. The largest portion, 128 msec, of this start time difference is due to a static delay within the vibrator electronics. The other 11.2 msec are due to the modulation/demodulation required for the radio connection and the many filters additionally passed by the P signal. The curve below the two Vibroseis signals is the residual phase shift remaining after the removal of the influence of start time difference and overall phase shift between the R and P signal.

FIG. 3 corresponds to FIG. 2. Here the signal P is compared with the acceleration of the base-plate recorded by means of a test accelerometer (Signal B). The large content of harmonics in signal B manifests itself in the rapid oscillations of the residual phase shift. Values of the residual phase shift beyond ±30° have been clipped in this representation.

What is claimed is:

1. A method for determining a time shift and a total phase difference between two signals, comprising the steps of
    a. determining a value $\psi(f)$, representative of the phase relationship between the two signals, for each frequency $f$ contained in the two signals;
    b. providing $g$ signals, corresponding to the values, in accordance with the determination and corresponding $f$ signals;
    c. determining a slope $A$ and an ordinate intercept $B$ of a best-fitting straight line $g(f) = Af+B$ through the totality of the values $\psi$ in accordance with the $g$ and $f$ signals
    d. providing a slop signal and an intercept signal corresponding to the slope $A$ and the ordinate intercept $B$ in accordance with the next previous step;
    e. providing a signal $\tau$ corresponding to the time shift in accordance with the slope signal and the following equation $$\tau = A/2\pi;$$

and
    f. providing a signal $\psi_0$ corresponding to the total phase shift in accordance with the intercept signal and the following equation $$\psi_0 = B \text{ modulo } (2\pi).$$

2. A method as described in claim 1 wherein the values $\psi(f)$ giving the phase relationship between the two signals are equal to the arcustangent of the quotient of co-spectrum and quadrature spectrum of the two signals.

3. A method as described in claim 2, further comprising the step of determining a residual phase shift $\psi(f)-g(f)$, and representing the residual phase shift analogically in the form of a curve dependent on the frequency.

4. A method as described in claim 3, wherein a characteristic value for the amount of residual phase shift within the frequency range of the two signals is determined and a corresponding digital output is provided.

5. A method as described in claim 4, wherein the absolute magnitude of the greatest residual phase shift is determined as the characteristic value for the amount of residual phase shift between the two signals.

6. A method as described in claim 5, further comprising the steps of determining the standard deviation of the residual phase shift as a characteristic value for the amount of residual phase shift, and providing a corresponding digital output.

7. A method as described in claim 1 wherein the values $\psi(f)$ giving the phase relationship between the two signals are equal to the difference of the phase spectra of the two signals, so that a multiple of $2\pi$ is added to, or subtracted from, the difference of the two phase spectra until the thus modified difference varies from the difference established at the preceding frequency by less than $\pi$.

8. A method as described in claim 7 further comprising the steps of determining a residual phase shift $\psi(f)-g(f)$ and is represented analogically in the form of a curve dependent on the frequency.

9. A method as described in claim 8, wherein a characteristic value for the amount of residual phase shift within the frequency range of the two signals is determined and a corresponding digital output is provided.

10. A method as described in claim 9, wherein the absolute magnitude of the greatest residual phase shift is determined as the characteristic value for the amount of residual phase shift between the two signals.

11. A method as described in claim 10, further comprising the steps of determining the standard deviation of the residual phase shift as a characteristic value for the amount of residual phase shift, and providing a corresponding digital output.

12. Apparatus for determining the time shift and total phase difference between two signals comprising phase difference means adapted to receive the two signals for determining a value $\psi(f)$, representative of the phase relationship between the two signals, for each frequency $f$ contained in the two signals, and providing corresponding $g$ signals, and their associated $f$ signals, slope and intercept means connected to the phase difference means for determining a slope $A$ and an ordinate intercept $B$ of a best fitting straight line $g(f) = Af+B$ through the totality of the values $\psi$ in accordance with the $f$ and $g$ signals and providing signals $A$ and $B$ corresponding to the slope $A$ and the ordinate intercept $B$; time shift signal means connected to the slope and intercept means for providing an output corresponding to the time shift $\tau$ in accordance with signal $A$ and the following equation:

$$\tau = A/2\pi;$$

and total phase shift signal means connected to the slope and intercept means for providing an output $\psi_0$ corresponding to the total phase shift in accordance with signal $B$ and the following equation:

$$\psi_0 = B \text{ modulo } (2\pi).$$

13. Apparatus as described in claim 12 further comprising means connected to the slope and intercept means for providing an output corresponding to a residual phase shift, which is the difference between points on the best fitted straight line and their corresponding $\psi$ values, in accordance with the $g$ signals.

14. Apparatus as described in claim 13 in which the residual phase shift output corresponds to the absolute value of the residual phase shift.

15. Apparatus as described in claim 13 in which the residual phase shift output corresponds to the standard deviation of the residual phase shift.

* * * * *

UNITED STATES PATENT AND TRADEMARK OFFICE
CERTIFICATE OF CORRECTION

PATENT NO. : 4,065,665
DATED : December 27, 1977
INVENTOR(S) : Eike Rietsch

It is certified that error appears in the above—identified patent and that said Letters Patent is hereby corrected as shown below:

Column 7, line 21, "signals" should read -- signals, --.

Column 7, line 37, "$(2\gamma)$" should read -- $(2\pi)$ --.

*Signed and Sealed this*

*Twenty-second* Day of *January 1980*

[SEAL]

*Attest:*

SIDNEY A. DIAMOND

*Attesting Officer*     *Commissioner of Patents and Trademarks*